United States Patent [19]

Engles

[11] Patent Number: 4,879,682

[45] Date of Patent: Nov. 7, 1989

[54] SENSE AMPLIFIER PRECHARGE CONTROL

[75] Inventor: Bruce E. Engles, Austin, Tex.

[73] Assignee: Motorola, Inc., Schaumburg, Ill.

[21] Appl. No.: 244,368

[22] Filed: Sep. 15, 1988

[51] Int. Cl.[4] ............................................ G11C 13/00
[52] U.S. Cl. .............................. 365/189.01; 307/530; 365/189.05; 365/230.06; 365/207; 365/203
[58] Field of Search ...................... 365/189.01, 189.04, 365/189.05, 230.01, 230.03, 230.06, 149, 207, 241, 203; 307/530

[56] References Cited

U.S. PATENT DOCUMENTS 4,809,227  2/1989  Suzuki et al. .................... 365/189.01

Primary Examiner—Terrell W. Fears
Attorney, Agent, or Firm—James L. Clingan, Jr.

[57] ABSTRACT

A non-volatile memory has a sense amplifier having a select side and a reference side which compares the current drawn by a selected bit line to the current drawn by a reference bit line. There is a column decoder which selects the bit line and couples it to the select side of the sense amplifier. The column decoder adds capacitance so that the capacitance is greater on the select side of the sense amplifier than on the reference side. The natural result of the capacitance imbalance was slowing of the speed with which the sense amplifier could provide reliable sensing. There is provided circuitry for compensating for this capacitance imbalance.

15 Claims, 2 Drawing Sheets

SENSE AMPLIFIER PRECHARGE CONTROL

FIELD OF THE INVENTION

The present invention relates to sense amplifiers, and more particularly, to techniques for sensing data stored in memory cells in a non-volatile memory.

BACKGROUND OF THE INVENTION

A sense amplifier for use in a non-volatile memory was disclosed in U.S. Pat. Nos. 4,713,797, Morton et al and 4,727,519, Morton et al. The sense amplifier disclosed in those two patents compared the current in a reference bit line to the current in a selected bit line. The reference bit line very accurately simulated bit lines in the array so that the current comparison technique was very effective for providing reliable sensing. The sense amplifier was common to many bit lines with a column decoder coupling only the selected bit line to the sense amplifier. The column decoder for many bit lines was thus also coupled to the sense amplifier but only to the side of the sense amplifier which was coupled to the selected bit line. The column decoder thus added capacitance to the select side of the sense amplifier. Reproducing the column decoder on the reference side of the sense amplifier required too much space and was not considered practical. The result was that the charging of the reference bit line was faster than the charging of the selected line because of the additional capacitance on the selected side of the sense amplifier. This did not adversely affect the ability of the sense amplifier to provide reliable detection but it did adversely affect the speed of detection.

SUMMARY OF THE INVENTION

Accordingly, it is an object of the present invention to provide an improved sense amplifier.

It is another object of the invention to provide a non-volatile memory with an improved sense amplifier.

It is yet another object of the invention to provide an improved sense amplifier for a non-volatile memory.

In carrying out these and other objects of the invention, there is provided, in one form, a memory having an array of non-volatile memory cells which are in either a programmed or unprogrammed state. The programmed state is characterized as having a first conductivity and the unprogrammed state is characterized as having the second conductivity. The memory cells are located at intersections of word lines and bit lines. The memory has a sense amplifier, a decoder, a precharge circuit, a reference bit line, and a coupling circuit. The sense amplifier has a first input and a second input for comparing current drawn from said first input to the current drawn from said second input and provides an output signal. The decoder circuit selectively couples one of said bit lines to the first input of the sense amplifier. The first precharge circuit precharges the bit lines to a first voltage in response to a precharge signal being active. The coupling circuit couples the reference bit line to the second input of the sense amplifier in response to a reference signal becoming active. The reference signal becomes active a predetermined time period after the precharge signal is no longer active.

DETAILED DESCRIPTION OF THE INVENTION

Figure 1:
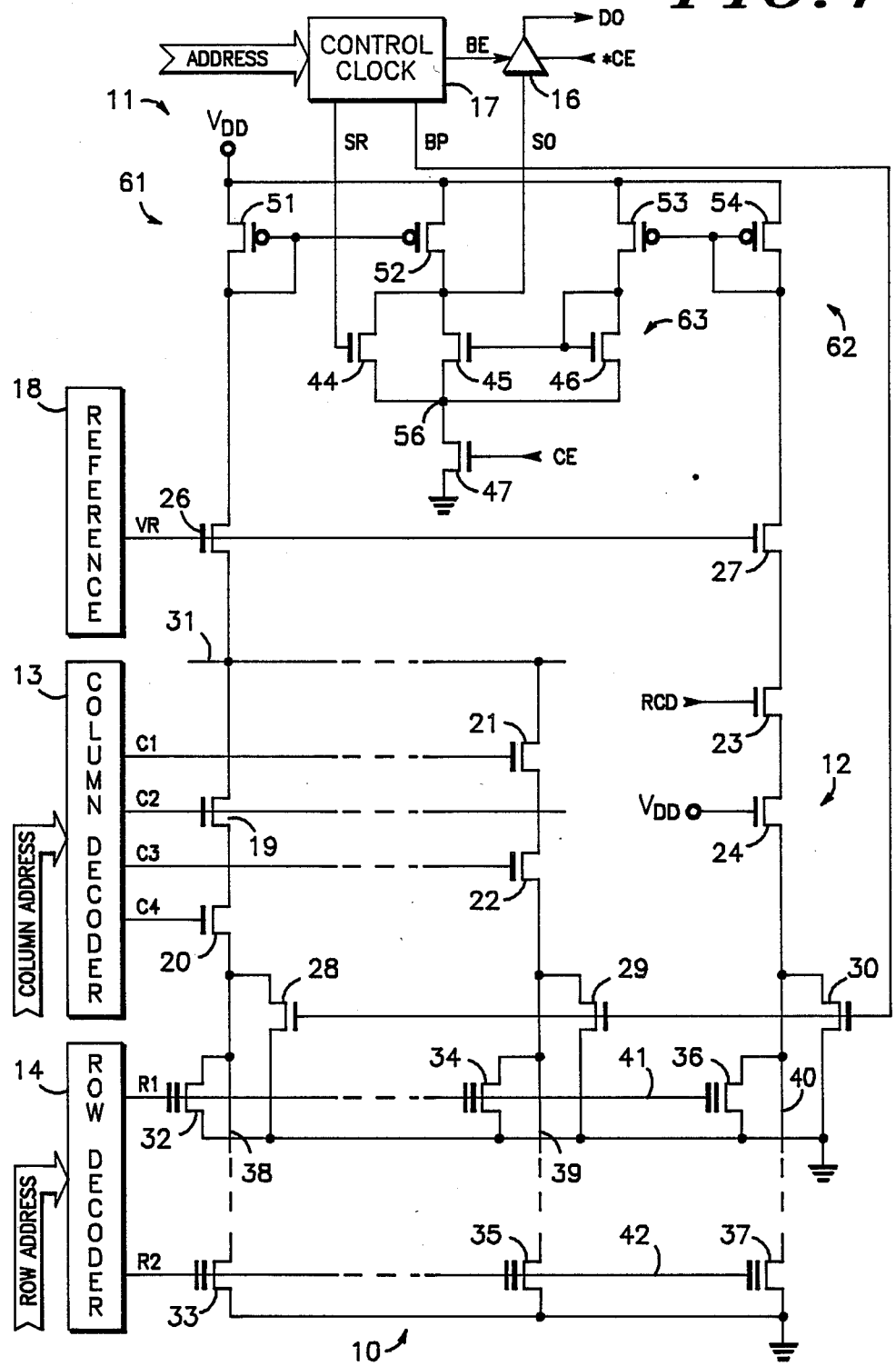
FIG. 1 is a combination block and circuit diagram of a non-volatile memory according to a preferred embodiment of the invention.

Shown in FIG. 1 is a memory 10 comprised generally of a sense amplifier 11, a memory array 12, a column decoder 13, a row decoder 14, an output buffer 16, a control clock 17, reference voltage generator 18, coupling transistors 19, 20, 21, 22, 23, 24, 26, and 27, bit line precharge transistors 28, 29, 30, and a data line 31. Transistors 19-24 and 26-30 are N channel transistors. Memory 10 has both N and P channel transistors for controlling array 12. The N channel transistors have a threshold voltage between 0.5 and 0.8 volt. The P channel transistors have a threshold voltage of between −0.5 and −0.8 volt. Array 12 is comprised of floating gate transistors which are either in a low or high threshold state. The floating gate transistors shown in FIG. 1 comprising array 12 are transistors 32, 33, 34, 35, 36, and 37; bit lines 38, 39, and 40; and word lines 41 and 42. Floating gate transistors are EPROM cells which are erased to the low threshold voltage state by the application of ultra-violet light and are electrically programmed to the high threshold state. This is conventional for EPROM cells. Sense amplifier 11 is comprised of N channel transistors 44, 45, 46 and 47 and P channel transistors 51, 52, 53, and 54.

Column decoder 13 provides a plurality of outputs for selecting which bit line will provide data to date line 31. Column decoder 13, as determined by a column address coupled to column decoder 13, causes two of these outputs to become active in order to implement the bit selection. The outputs shown in FIG. 1 are signals C1, C2, C3, and C4. Transistor 19 has a drain connected to data line 31, a gate for receiving signal C2 from column decoder 13, and a source. Transistor 19 has a drain connected to data line 31, a gate for receiving signal C2 from column decoder 13, and a source. Transistor 20 has a drain connected to the source of transistor 19, a gate for receiving signal C4 from column decoder 13, and a source connected to bit line 38. Transistor 21 has a drain connected to data line 31, a gate for receiving a signal C1 from column decoder 13, and a source. Transistor 22 has a drain connected to the source of transistor 21, a gate for receiving signal C3 from column decoder 13, and a source connected to bit line 39. When bit line 38 is selected by the column address, column decoder 13 drives signals C2 and C4 active at a logic high so that transistors 19 and 20 couple bit line 38 to data line 31. When bit line 39 is selected by the column address, column decoder 13 drives signals C1 and C3 active at a logic high so that transistors 21 and 22 couple bit line 39 to data line 31. Transistors 23 and 24 are used to simulate transistor coupling pairs 19-20 and 21-22. Transistor 23 has a gate for receiving a reference column-decoder signal RCD, a drain a, and a source. Transistor 24 has a drain connected to the source of transistor 23, a gate connected to a positive power supply terminal VDD for receiving a positive power supply voltage such as 5 volts, and a source connected to bit line 40. Transistor 23, in addition to simulating transistor coupling pairs 19-20 and 21-22, also provides improved precharge operation.

Reference voltage generator 18 has an output which provides a reference voltage VR at about 2.1 volts. Voltage VR is used to limit the voltage on a selected bit line such as one of bit lines 38 and 39. Voltage VR limits bit line 31 via transistor 26. Transistor 26 has a drain connected to a data input of sense amplifier 11, a gate for receiving voltage VR from reference voltage generator 18, and a source connected to data line 31. The voltage on data line 13 is thus limited to voltage VR of about 2.1 volts minus the threshold voltage of transistor 26. This threshold voltage including body effect, which is well known in the art, will be nominally 0.9 volt. Consequently, the voltage on data line 13 will be limited to about 2.1 minus 0.9 which equals 1.2 volt. With data line 31 limited in voltage, a selected bit line is also so limited. Transistor 27 is used to match the effect of transistor 26. Transistor 27 has a drain connected to a reference input of sense amplifier 11, a gate for receiving voltage VR from generator 18, and a source connected to the drain of transistor 23. Transistor 27 limits the voltage on the drain of transistor 23 in the same way that transistor 26 limits the voltage on data line 31. With the drain of transistor 23 limited in voltage, bit line 40 is limited in voltage in the same way as a selected bit line is limited in voltage.

Transistors 28-30 are used to precharge it lines 38-40 to voltage near ground potential in response to a bit line precharge signal BP generated by control clock 17. Transistor 30 has a gain which is about seven times greater that that of transistor 28 and 29 to ensure that reference bit line 40 is precharged to ground. Transistors 28, 29, and 30 each have a gate for receiving signal BP from clock 17, a source connected to ground, and a drain. The drains of transistors 28, 29 and 30 are connected to bit lines 38, 39, and 40, respectively. When clock 17 drives signal BP active to a logic high, transistors 28 and 29 precharge bit lines 38 and 39 by discharging bit lines 38 and 39 well below the voltage to which bit lines 38 and 39 are limited by voltage VR and transistors 26 and 27.

Transistors 32-37 are programmed to either a high threshold voltage or a low threshold voltage. The low threshold state is the erased state obtained after exposure to ultra-violet light. Programming of array 12 is achieved by selectively raising the threshold voltage of the floatig gate transistors which comprise array 12 such as transistors 32-35. Transistors 36 and 37 are used as references and are in the erased state only. Transistor 32 has a drain connected to bit line 38, a gate connected to word line 41, and a source connected to ground. Transistor 33 has a drain connected to it line 38, a gate connected to word line 42, and a source connected to ground. Transistor 34 has a drain connected to bit line 39, a gate connected to word line 41, and a source connected to ground. Transistor 35 has a drain connected to bit line 39, a gate connected to word line 42, and a source connected to ground. Transistor 36 has a drain connected to bit line 40, a gate connected to word line 41, and a source connected to ground. Transistor 37 has a drain connected to bt line 40, a gate connected to word line 42, and a source connected to ground. Row decoder 14 has a plurality of row decoder output signals for enabling a word line as selected by a row address received by row decoder 14. In response to the row address, row decoder 14 causes one of these row decoder output signals to become active. This type of row decoder is well known in the art. Row decoder output signals R1 and R2 are shown as being outputs of row decoder 14. Row decoder 14 outputs signal R1 onto word line 41 and signal R2 onto work line 42. A word line is enabled when the row decoder output signal corresponding thereto is active at a logic high. Word line 41 is enabled when row decoder 14 provides signal R1 at a logic high. Word line 42 is enabled when row decoder 14 provides signal R2 at a logic high. When word line 41 is enabled, transistors 32, 34, and 36 are activated in accordance with the threshold voltage to which they are programmed. It is desirable that the high threshold voltage be above VDD so that the memory cell transistor having been programmed to the high voltage state will be completely non-conductive when the word line to which it is connected is enabled. The low voltage state is desirable well below the voltage of an enabled word line so that a memory cell transistor having the low voltage state will be highly conductive when the word line to which it is connected to enabled.

In practice, however, the high threshold voltage may not exceed VDD. A memory cell transistor which is programmed to the high voltage state may in fact be conductive when the word line is enabled. The high and low threshold voltage states must then be distinguished on the basis of relative degree of conductivity rather than simply distinguishing betweenmemory cells which are conductive or non-conductive. Bit line 40 and the memory cells connected thereto are used as a reference for emulating an unprogrammed cell. Sense amplifier 11 compares the conductvity of its reference input to that of its data input to determine if the selected memory cell which is coupled to the data inputs is in the low or high threshold state. Sense amplifier 11 provides a sense amplifier output signal SO at a logic high when the selected memory cell is in the low threshold state which is the relatively higher conductivity state. Signal SO is provided at a logic low when the selected memory cell is in the high threshold voltage state which is the relatively lower conductivity state. Buffer 16 has an input for receiving signal SO an an output for providing data output signal DO. Buffer 16 receives a ship enable signal CE and a buffer enable signal BE. The chip enable signal CE is derived from an externally generated signal *CE which enables memory 10 at a logic low and disables memory 10 at a logic high. This operation of memory 10 in response to signal *CE is conventional. Signal CE is complementary to signal *CE. Amplifier 11 is enabled when signal CE is a logic high and disable when signal CE is a logic low. Buffer 16 is clockd by a buffer enable signal BE received from clock 17. When signal BE is active, buffer 16 provides signal DO responsive to the logic state of signal SO. When signal BE is inactive, buffer 16 is inactive and provides signal DO as a high impedance. A buffer with this high impedance feature is commmonly known as a tri-state buffer. Clock 17 includes a timing feature so that signal BE is provided in the active state just when sense amplifier 11 provides signal SO as a valid indication of the program state of the selected memory cell. Buffer 16 has comparatively large drive capability which causes it to draw significant current when it changes state. Signal BE is used to hold buffer 16, in a predetermined state, tri-stated, until signal SO is indicative of the logic state of the accessed memory cell. This prevents any portion of the actual sensing operation from being disturbed by switching transients or by noise coupled into array 12 which occurs when buffer 16 switches logic states.

Transistor 51 has a drain and a gate, which act as the data input of sense amplifieir 11, connected to the drain of transistor 26, and a source connected to VDD. Transistor 52 has a source connected to VDD, a gate connected to the drain and gate of transistor 51, and a drain as the output of sense amplifier 11. Transistor 44 has a drain connected to the drain of transistor 52, a gate for receiving a sense amplifier reset signal SR from clock 17, and a source connected to a node 56. Sense amplifier 11 is reset by signal SR becoming active at a logic high which causes signal SO to be logic low. Node 56 is clamped to ground by transistor 47 during the operation of sense amplifier 11. Transistor 47 has a drain connected to node 56, a gate for receiving a chip enable signal CE. Sense amplifier 11 is enabled by chip enable signal CE being active.

When signal CE is active, transistor 47 clamps node 56 to ground. Signal CE is a signal provided externally to memory 10.. When signal CE is active, it indicates that memory 10 is to respond to the addresses it receives to either perform a read or a write. Thus, for operational purposes, node 56 can be viewed as ground. Transistor 45 has a drain connected to the drain of transistor 52, a source connected to node 56, and a gate. Transistor 46 has a source connected to node 56, a drain and a gate connected to the gate of transistor 45. Transistor 53 has a source connected to VDD, a gate connected to the gate and drain of transistor 54, and a drain connected to the gate and drain of transistor 46.

Sense amplifier 11 is initialized for a new sensing operation when signal SR becomes active which resets signal SO to a logic low. Signal SR is active as a logic high pulse of 45-85 nanoseconds (ns) in duration. This duration of signal SR at a logic high varies with process variations. Signal SR becomes active in response to an address transition or in response to signal CE becoming active. When an address has changed, a new bit line and/or a new word line is selected. In response to the address transition, signal BP is also activated as a logic high pulse of about 10 ns. This precharges the bit lines, including bit line 38, below the voltage limit of about 1.2 volt supplied by signal VR via transistor 26. Due to the high gain of transistor 30 and due to transistor 23 being non-conductive, reference bit line 40 is precharged all the way to ground potential. Transistor 23 being non-conductive prevents current from flowing to bit line 40 from transistor 54. This is ensures that the certain reference voltage of ground is reached on bit line 40 during precharge. Assume that transistor 32 is the newly selected memory cell which is selected by row decoder 14 selecting word line 41 and column decoder 13 selecting bit line 38. Word line 41 is enabled and bit line 38 is coupled to data line 31. Transistors 32 and 36 accordingly receive logic high inputs on their gates. Also assume that transistor 32 is in the erased or low threshold state. All of the transistors in array 12 are closely matched. Consequently, transistors 32 and 36 have very nearly the same conductivity.

Current is supplied from transistor 51 to bit line 38. This current is determined by the conductivity of transistor 32 and the voltage lmiting affect of signal VR. Transistor 54 similarly supplies current to bit line 40. The current supplied vis transistor 54 to bit line 40 is determined by the conductivity of transistor 36 and the voltage limiting affect of signal VR. With bit lines 38 and 40 at the same voltage and transistors 32 and 36 having the same conductivity, the currents through transistors 51 and 54 are the same. Transistors 51 and 54 are both forced into the saturation region of operation due to the gate to drain connection. The saturation region of operation is characterized as being that region of operation in which the current through the transistor is limited by the gate to source voltage and can increase only slightly with increases in the magnitude of the drain to source voltage.

Transistors 52 and 53 form current mirrors with transistors 51 and 54. Transistors 51 and 52 form a current mirror 61 in which transistor 51 is the master and transistor 52 is the slave. Transistors 53 and 54 form a current mirror 62 in which transistor 54 is the master and transistor 53 is the slave. The gains and thresholds of transistors 53 and 54 are matched to be the same. The actual values of the gains and thresholds of transistors are difficult to keep constant over process variations which are likely to occur. The relative gains and thresholds of the same transistor types, however, are quite constant with process variations if care is taken in the layout of the transistors. The capability of maintianing relative gains and thresholds is known in the art. Consequently, the gains and thresholds of transistors 53 and 54 can be relied upon the be the same. The current flowing through transistor 54 is thus relfected to transistor 53 in a one to one ratio. In a current mirror configuration the master is forced into the saturation region, and the slave has the same gate to source voltage as the master so that the current flowing through the slave will be in proportion of the current flowing through the master as determined by the gain ratios of the master and the slave so long as there is not some other mechanism operating to limit the current below that established by the gain ratios. Transistors 46 and 47 are in series with transistor 53 but are of sufficient gain to not cause current limiting through transistor 53. The current through transistor 53 is very close to the current flowing through transistor 54. Transistor 46 has the same current as transistor 53 and therefore the same as transistor 54. Transistors 45 and 46 form a current mirror 63 in which transistors 46 is the master and transistor 45 is the slave. Transistor 45 is chosen to have the same gain as transistor 46 so that transistor 45 is limited to carying no more than the current flowing through transistor 54.

Transistor 52 is chosen to have a gain twice that of transistor 51 so that the current carrying capablity of transistor 52 is twice that of the current flowing through transistor 51. A convenient technique to obtain double gain is to fabricate two identical transistors in parallel. This also is convenient for obtaining a matching threshold voltage. In the case of selecting an unprogrammed memory cell, the current flowing through transistors 51 and 52 is virtually the same. This results in transistor 52 having twice the current carrying capability of transistor 45. In such case transistor 45 is in the saturation region, but transistor 52 is in the triode region. The resulting voltage of signal SO is very near VDD. Buffer 16 thus easily recognizes signal SO as a logic high for the case in which a selected memory cell is in the low threshold state.

For the case in which the selected memory cell, transistor 32 in the present example, is in the high threshold voltage state, the conductivity of the selected memory cell is much less than the selected reference cell, reference cell 36 in the present example. The current through transistor 32 as the selected memory cell is determined by the voltage on bit line 38 and the conductivity of transistor 32. With the conductivity substantially reduced for the high threshold state and the bit line voltage the same, the current is substantially reduced in comparison to the low threshold voltage state. Typically, the conductivity of transistor 32 will be at least 10 times less for the high threshold voltage state than for the low threshold voltage state. Assume for example a ratio of four to one between logic states so that the current drawn from transistor 51 by transistor 32 is one fourth of that drawn from transistor 54 by transistor 36. The current carrying capability of transistor 45 is equal to the current flowing through transistor 54. Because, in this example, the current flowing through transistor 54 is four times that flowing through transistor 51, the current carrying capability of transistor 45 is four times the current flowing through transistor 51. Therefore, the current carrying capability of transistor 45 is twice that of transistor 52. The resulting voltage of signal SO is very near zero or ground potential. This voltage is easily recognizable by buffer 19 as a logic low for the case in which the selected memory cell is programmed to the high threshold voltage state.

When the current carrying capability of transistor 52 is twice as great as that of transistor 45, sense amplifier 11 provides signal SO at a voltage easily recognizable as a logic high. When the current carrying capability of transistor 45 is twice as great as that of transistor 52, sense amplifier 11 provides signal SO at a voltage easily recognizable as a logic low. Transistors 54, 53, and 46 act to limit the current carrying capability of transistor 45 in relation to the conductance of a selected reference memory cell. Transistor 51 acts to limit the current carrying capability of transistor 52 in relation to the conductance of the selected memory cell. Transistor 54 establishes a reference current therethrough which is related to the conductvity of a reference cell. Transistors 46, 53, and 54 cause transistor 45 to be current limited to the reference current. The conductivity of the reference cell is made to be virtually the same as the conductivity of a memory cell in the low voltage state because the reference cell is made of the same as a memory cell and is left in the unprogrammed state which is the low voltage state. Transistor 51 establishes a current therethrough represenatative of the logic state of selected memory cell. When the logic state of the selected memory cell is different than that of the reference cell, the current through transistor 51 causes the current carrying capability of transistor 52 to be significantly less than the current carrying capability of transistor 45.

Sense amplifier 11 thus has a crossover point between a logic low and a logic high at a one half current point between reference bit line 40 and the selected bit line. The logic state detected by sense amplifier 11 when the reference bit line current is twice the selected bit line is indeterminate. When the selected bit line is drawing less than half the current of that drawn by the selected bit line, sense amplifier 11 detects that the enabled memory cell on the selected bit line is programmed to the high threshold voltage. Node 31 has additional capacitance due to the many bit lines such as bit lines 38 and 39 which can be coupled to sense amplifier 11. Node 31 acts as a data line to which many column decoder coupling transistors such as transistors 19 and 21 are coupled. This results in more capacitance being coupled to the selected side of sense amplifier 11 via transistor 26 than is coupled to the reference side of sense amplifier 11 via transistor 27. Thus when sense amplifier 11 begins sensing, more current is required from the selected side than from reference side to charge the capacitance which has been discharged during the precharge performed by transistors 28–30. This caused a problem in the speed of detection in the sense amplifier described in U.S. Pat. No. 4,713,797 for the case in which the enabled cell in the selected bit line was programmed to the high threshold voltage. The high threshold voltage state in the low current state. The additional current required to charge the additional capacitance associated with node 31 slowed the time required to reach the crossover point. By having transistor 30 have a greater gain than transistors 28 and 29 causes the reference bit line to be precharged to a lower voltage than the bit lines in the array. This then increases the amount of current carried by reference bit line 40 at the onset of sensing.

Transistor 23 is clocked by reference column decoder signal RCD which is delayed from the time that bit lines 38–40 are precharged. This further ensures that the onset current on bit line 40 is greater than on the selected bit line.The delay of enabling transistor 23 effectively pre-biases the sense amplifier 11 inputs to sensing the programmed state. The crossover to the unprogrammed state occurs sooner and more reliably than the crossover from the unprogrammed state to the programmed state for the prior art sense amplifier in which the sense amplifier inputs immediately following precharge were prebiased to sensing the unprogrammed state. The current in reference bit line 40 rapidly charges the capacitance on bit line 40 so that, for the case in which the enabled memory cell in the selected bit line is in the low threshold voltage state, the current drawn from sense amplifier 11 on the reference side rapidly reduces to a level which is less than twice that drawn on the selected side of sense ampliier 11.

Figure 2:
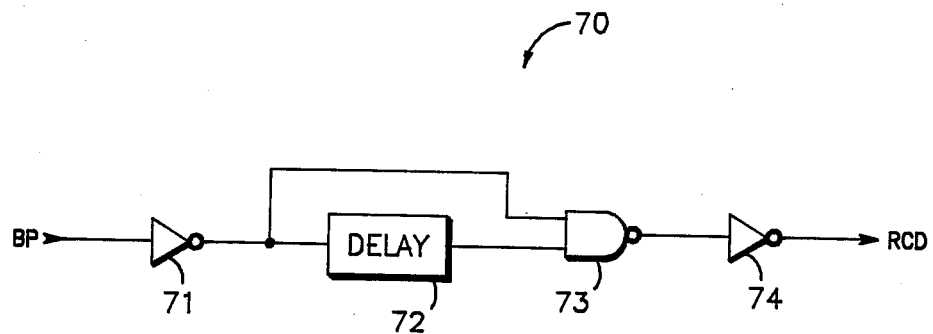
FIG. 2 is a combination block and logic diagram of a circuit for use in the memory of FIG. 1.

Signal RCD is delayed from signal BP by a clock circuit 70 shown in FIG. 2. Clock circuit 70 comprises an inverter 71, a delay circuit 72, a NAND gate 73, and an inverter 74. Inverter 71 has an input for receiving signal BP, and an output. Delay circuit 72 has an input connected to the output of inverter 71, and an output. NAND gate 73 has a first input connected to the output of inverter 71, a second input connected to the output of delay circuit 72, and an output. Inverter 72 has an input connected to the output of NAND gate 73, and an output connected to the gate of transistor 23 and providing signal RCD. When signal BP switches to logic high to precharge bit lines 38–40, inverter 71 outputs a logic low to NAND gate 73 which causes NAND gate 73 to output a logic high and inverter 74 to output signal RCD at a logic low. Delay circuit 72 responds to the output of inverter 71 by outputting a logic low to the second input of NAND gate 73. After the precharge period, signal BP switches to a logc low which causes inverter 71 to output a logic high. The first input of NAND gate 73 is thus switched to a logic high. The second input of NAND gate 73 remains at a logic lwo for a predetermined delay period set by delay circuit 72. NAND gate 73 thus continues providing a logic high output until the delay period elapses and delay circuit 72 outputs a logic high. When delay 72 outputs a logic high, which is after the predetermined delay period following the transition of the output of inverter 71, NAND gate 73 responds by outputting a logic low. Inverter 74 responds by outputting signal RCD at a logic high.

Circuit 70 thus responds to signal BP switching to a logic high by causing transistor 23 to be non-conductive. Transistor 23 becomes conductive again a predetermined delay period following signal BP switching to a logic low. Immediately after signal BP switches to a logic low, the selected bit line begins charging but the charging of the reference bit line is delayed by delay circuit 70. The delay in enabling of transistor 23 and the precharging of reference bit line 40 to ground compensates for the additional capacitance on node 31 and thus reduces the amoutnnt of time for sense amplifier 11 to determine the logic state of the enabled memory cell of the selected bit line.

While the invention has been described in a specific embodiment, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

I claim:

1. A memory having an array of non-volatile memory cells which are in either a programmed or unprogrammed state, wherein the programmed state is characterized as having a first conductivity and the unprogrammed state is characterized as having the second conductivity, said memory cells located at intersections of word lines and bit lines, comprising:
   a sense amplifier having a first input, and a second input, and an output;
   decoder means for selectively coupling one of said bit lines to the first input of said sense amplifier;
   first precharge means, coupled to the bit lines, for precharging the bit lines to a first voltage during a precharge period;
   a reference bit line;
   second precharge means, coupled to the reference bit line, for precharging the reference bit line to a second voltage during said precharge period, said second voltage being different than said first voltage; and
   coupling means for coupling the reference bit line to the second input of the sense amplifier a predetermined time period after the precharge period.

2. The memory of claim 1 wherein the coupling means comprises:
   a first transistor for coupling the reference bit line to the second input of the sense amplifier in response to a reference signal; and
   delay means for providing the reference signal in response to a precharge signal, said reference signal delayed from said precharge signal.

3. The memory of claim 2 wherein the delay means comprises:
   a first inverter having an input for receiving the precharge signal, and an output;
   a delay circuit having an input coupled to the output of the inverter, and an output;
   a NAND gate having a first input coupled to the output of the first inverter, a second output coupled to the output of the delay circuit, and an output; and
   a second inverter having an input coupled to the output of the NAND gate, and an output for providing the reference signal.

4. The memory of claim 3 wherein the precharge signal is characterized as being active as a logic high pulse of a first duration and the reference signal is characterized as being active at a logic high and being at a logic low for a secone duration, said second duration being greater than said first duration.

5. The memory of claim 2 wherein the second precharge means comprises a second transistor having a fist current electrode coupled to the reference bit line, a second current electrode coupled to a first power supply terminal, and a control electrode for receiving the precharge signal.

6. A memory having an array of non-volatile memory cells which are in either a programmed or unprogrammed state, wherein the programmed state is characterized as having a first conductivity and the unprogrammed state is characterized as having the second conductivity, said memory cells located at intersections of word lines and bit lines, comprising:
   sense amplifier means having a first input and a second input for comparing current drawn from said first input to the current drawn from said second input and providing an output signal;
   decoder means for selectively coupling one of said bit lines to the first input of said sense amplifier;
   first precharge means, coupled to the bit lines, for precharging the bit lines to a first voltage in response to a precharge signal being active;
   a refernce bit line; and
   coupling means for coupling the reference bit line to the second input of the sense amplifier in response to a reference signal becoming active, said reference signal becoming active a predetermined time period after the precharge signal is no longer active.

7. The memory of claim 6 wherein the coupling means comprises:
   a first transistor for coupling the reference bit line to the second input of the sense amplifier in response to the reference signal; and
   delay means, coupled to the first transistor, for causing the reference signal to be inactive for the predetermined time period after the precharge signal is no longer active.

8. The memory of claim 7 wherein the delay means comprises:
   a first inverter having an input for receiving the precharge signal, and an output;
   a delay circuit having an input coupled to the output of the inverter, and an output;
   a NAND gate having a first input coupled to the output of the first inverter, a second output coupled to the output of the delay circuit, and an output; and
   a second inverter having an input coupled to the output of the NAND gate, and an output for providing the reference signal.

9. The memory of claim 8 wherein the precharge signal is characterized as being active as a logic high pulse of a first duration and the reference signal is characterized as being active at a logic high and being at a logic low for a second duration, said second duration being greater than said fist duration.

10. The memory of claim 9 further comprising:
    second precharge means, coupled to the reference bit line, for precharging the reference bit line to a second voltage in response to the precharge signal, said second voltage being different than said first voltage.

11. The memory of claim 10 wherein the second precharge means comprises a second transistor having a first current electrode coupled to the reference bit line, a second current electrode coupled to a first power supply terminal, and a control electrode for receiving the precharge signal.

12. A memory comprising:
- an array comprised of word lines, bit lins, and memory cells, wherein the word lines and bit lines intersect and the memory cells are located at the intersections of the bit lines and word lines, each memory cell is in either a first or second state, each memory cell draws current representative of its state;
- sense amplifier means having a first input and a second input for comparing current drawn from said first input to the current drawn from said second input and providing an output signal;
- decoder means for selectively coupling one of said bit lines to the first input of said sense amplifier;
- a plurality of first transistors, each of said first transistors coupled to a respective bit line and enabled by a precharge signal being active, each of said first transistors having a first gain;
- a reference bit line;
- a second transitor coupled to said reference bit line, enabled by said precharge signal being active, and having a second gain, said second gain greater than said first gain;
- coupling means for coupling the reference bit line to the second input of the sense amplifier in response to a reference signal becoming active, said reference signal becoming active a predetermined time period after the precharge signal is no longer active.

13. The memory of claim 12 wherein the coupling means comprises:
- a third transistor for coupling the reference bit line to the second input of the sense amplifier in response to the reference signal; and
- delay means, coupled to the first transistor, for causing the reference signal to be inactive for the predetermined time period after the precharge signal is no longer active.

14. The memory of claim 13 wherein the delay means comprises:
- a first inverter having an input for receiving the precharge signal, and an output;
- a delay circuit having an input coupled to the output of the inverter, and an output;
- a NAND gate having a first input coupled to the output of the first inverter, a second output coupled to the output of the delay circuit, and an output; and
- a second inverter having an input coupled to the output of the NAND gate, and an output for providing the reference signal.

15. The memory of claim 14 wherein the precharge signal is characterized as being active as a logic high pulse of a first duration and the reference signal is characterized as being active at a logic high and being at a logic low for a second duration, said second duration being greater than said first duration.

* * * * *

UNITED STATES PATENT AND TRADEMARK OFFICE
CERTIFICATE OF CORRECTION

PATENT NO. : 4,879,682

DATED : November 07, 1989

INVENTOR(S) : Bruce E. Engles

It is certified that error appears in the above-identified patent and that said Letters Patent is hereby corrected as shown below:

Column 10, line 1, change "secone" to --second--.

Column 10, line 4, change "fist" to --first--.

Column 10, line 59, change "fist" to --first--.

Column 11, line 5, change "lins" to --lines--.

Signed and Sealed this

Eighteenth Day of September, 1990

Attest:

HARRY F. MANBECK, JR.

*Attesting Officer*  *Commissioner of Patents and Trademarks*